United States Patent [19]

Pedersen

[11] Patent Number: 5,606,266
[45] Date of Patent: Feb. 25, 1997

[54] PROGRAMMABLE LOGIC ARRAY INTEGRATED CIRCUITS WITH ENHANCED OUTPUT ROUTING

[75] Inventor: Bruce B. Pedersen, San Jose, Calif.

[73] Assignee: Altera Corporation, San Jose, Calif.

[21] Appl. No.: 497,504

[22] Filed: Jun. 30, 1995

Related U.S. Application Data

[63] Continuation-in-part of Ser. No. 334,879, Nov. 4, 1994, abandoned.

[51] Int. Cl.$^6$ .............................................. H03K 19/177
[52] U.S. Cl. ................................. 326/41; 326/39
[58] Field of Search ................... 326/39, 40, 41

[56] References Cited

U.S. PATENT DOCUMENTS

| 4,758,985 | 7/1988 | Carter | 326/40 |
|---|---|---|---|
| 5,109,353 | 4/1992 | Sample et al. | 364/578 |
| 5,260,611 | 11/1993 | Cliff et al. | 326/39 |
| 5,317,210 | 5/1994 | Patel | 326/40 |
| 5,338,984 | 8/1994 | Sutherland | 326/39 |
| 5,359,242 | 10/1994 | Veenstra | 326/39 |
| 5,371,422 | 12/1994 | Patel et al. | 326/39 |
| 5,455,525 | 10/1995 | Ho et al. | 326/39 |

OTHER PUBLICATIONS

Patterson et al.; Computer Architecture: A Quantitative Approach; copyright 1990 by Morgan Kaufmann Publishers, Inc.; pp. 204–206.

*Primary Examiner*—Edward P. Westin
*Assistant Examiner*—Benjamin D. Driscoll
*Attorney, Agent, or Firm*—Townsend and Townsend and Crew, LLP

[57] ABSTRACT

A programmable logic device (10) has a number of programmable logic elements (LEs) (12) which are grouped together in a plurality of logic array blocks (LABs) (14). A general interconnect structure (20, 30) is provided for interconnecting a LAB with other LABs. A LAB-based interconnect structure (24, 26) is provided for connecting inputs of the LEs in a LAB to a subset of the general interconnect. One or more of output signal lines (55) are included in the LAB-based interconnect structure and are connectable to device output pins. A digital information processing system incorporating the invention is disclosed.

28 Claims, 6 Drawing Sheets

PROGRAMMABLE LOGIC ARRAY INTEGRATED CIRCUITS WITH ENHANCED OUTPUT ROUTING

This patent application is a continuation-in-part of Ser. No. 08/334,879, filed Nov. 4, 1994, abandoned.

BACKGROUND OF THE INVENTION

The present invention relates to the field of digital electronic circuits. More specifically, in one embodiment the invention provides an improved programmable logic device with enhanced output routing as well as associated methods of operation.

Programmable logic devices (PLDs) are well known to those in the electronics art. Such programmable logic devices are commonly referred to as PALs (Programmable Array Logic), PLAs (Programmable Logic Arrays), FPLAs (Field Programmable Logic Arrays), EPLDs (Electronically Programmable Logic Devices), EEPLDs, LCAs (Logic Cell Arrays), FPGAs (Field Programmable Gate Arrays), and the like. Such devices are used in a wide array of applications where it is desirable to configure or program an off the shelf device for a specific application. Such devices include, for example, the well known Classic™ EPLDs, MAX® 5000 EPLDs, and FLEX® EPLDs all made by Altera®.

These devices, while similar in some aspects of overall functionality, may be of very different types in terms of circuit architecture. One family of PLDs uses a sum-of-products (SOP) architecture whereby each output is the ORed sum of a number of ANDed product terms of the inputs. This family is represented by the Altera MAX® and Classic™ 5000 EPLDs. Another family of PLDs uses look-up tables (LUTs) to perform logic functions. This family is represented by the Altera FLEX® EPLDs.

Modern PLDs generally are constructed from small functional units variously referred to as logic modules or macrocells and herein referred to as logic elements (LEs). These LEs are typically identical or nearly identical throughout the PLD and perform a function that is a sub unit of the function of the entire PLD. For example, in a PLD based on an LUT architecture, the LEs might each be four input/one output LUTs. PLDs generally include an interconnect structure of conductors to provide a mechanism for selectively connecting the inputs and outputs of the LEs in order to perform the PLD functionality.

Larger PLD's of both the SOP and LUT type generally group the smaller LEs into larger functional units herein referred to as logic array blocks (LABs). The LABs can contain within them a local LAB interconnect that allows signals in one LE to be selectively connected to signals in a different LE in the same LAB and that transmits signals from the global interconnect to the inputs of the individual LEs. The LABs may be connected to one another and to input and output circuits by means of the global interconnect, While such devices have met with substantial success, such devices also meet with certain limitations.

For example, larger PLDs are generally provided with a large number of external input/output pins for transmitting signals off-chip, but the interconnect structure of such PLDs is such that a particular LE on the chip has direct access to a very limited number of I/O pins. A typical PLD may have as many as two hundred to four hundred or more I/O pins. Such devices are also provided with an intricate global interconnect structure for allowing individual functional elements on the PLD to communicate signals with all other elements on the PLD. For reasons of conserving chip area, this global interconnect structure is connected to the external pins in a limited way such that a particular LE on the chip has direct access to a very limited number of I/O pins. If a signal from a LE must be transmitted to an I/O pin to which that LE does not have direct access, the signal must be routed through an additional LE that has direct access to that I/O pin. This can create problems in PLD reprogrammability and modifiability of certain logic designs. For example, if a minor modification in an application requires that a logic signal be routed to a different I/O pin, ideally the PLD should be easily reprogrammable to accommodate this modification. However, with the limitations of some prior art PLDs, rerouting a logic signal to a different I/O pin could require use of additional LEs. If these LEs were unavailable because they were being used in other parts of the design, modification of the chip to reroute the output signal might be impossible.

From the above it is seen that an improved programmable logic device is desired.

SUMMARY OF THE INVENTION

The invention provides an improved programmable logic device for use in digital circuits and systems in which a LAB may be provided with lines in its LAB interconnect that are directly connected to an external I/O pin driver. This design allows the output pin routing to take advantage of the flexibility of routing of signals into the LABs that is built into the PLD. The flexibility in output routing provided by the invention allows for PLDs that are much improved in their ability to accommodate applications that require particular output pin assignments. This improves the routing of output signals by not requiring that a signal going to a particular I/O pin be directed through a particular group of LEs. It also improves the functionality of the device by not requiring an extra logic element to get an output signal to a particular I/O pin and allows direct connection between an input signal on one I/O pin and an output signal on another I/O pin without routing the signal through a LE.

A computer system or other digital processing machine incorporating the invention will benefit from the added flexibility and reprogrammability of the PLD.

DESCRIPTION OF THE INVENTION

For the sake of clarity, the invention will be explained with reference to a PLD architecture that was disclosed in co-assigned U.S. Pat. No. 5,260,611 (the '611 patent) which is incorporated herein by reference. Some figures from that patent are reproduced here to aid in an understanding of the invention. However, it will be apparent to one skilled in the art that the invention may be used in a very wide variety of different PLD architectures including architectures that are fundamentally different from that disclosed in the '611 patent.

Figure 1:
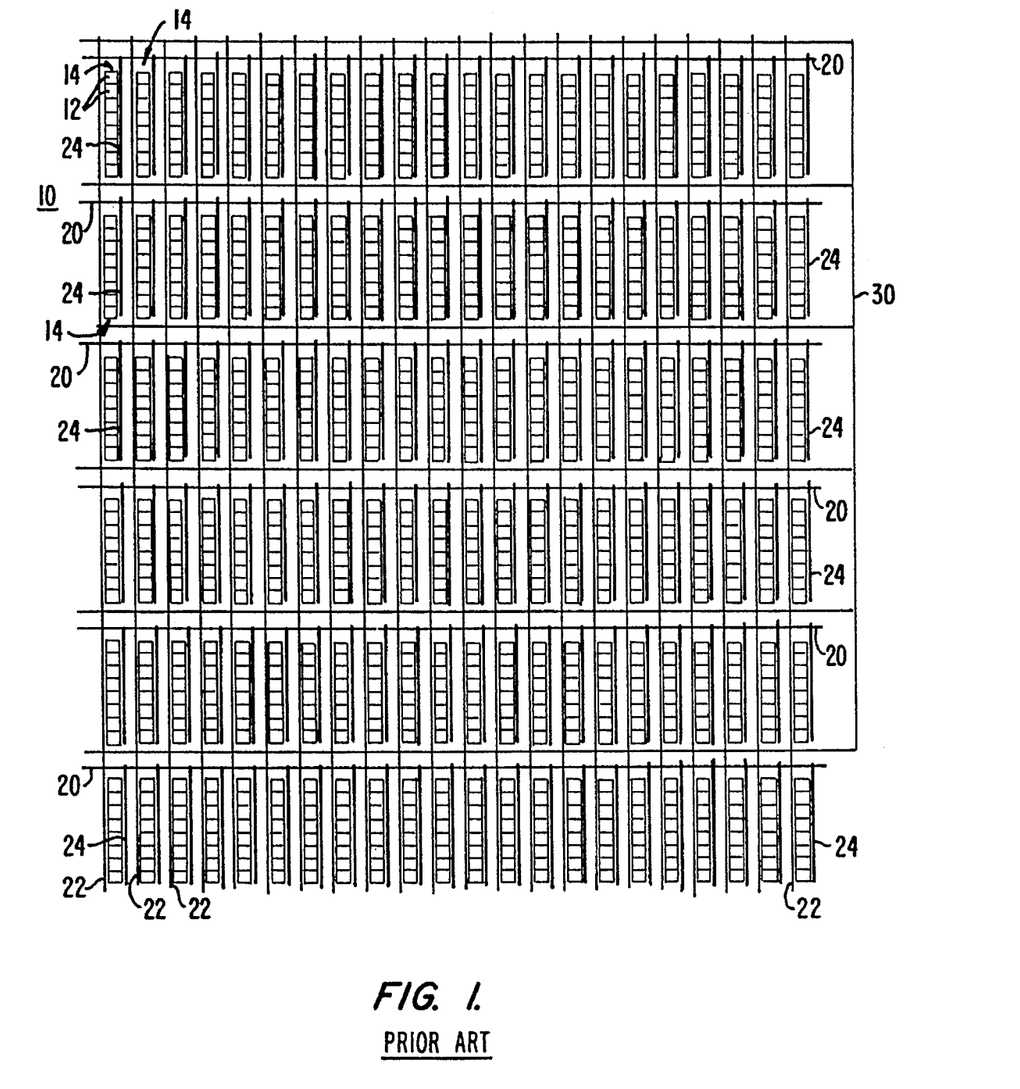
FIG. 1 is a simplified block diagram of a prior art PLD.

FIG. 1 shows the overall organization of an illustrative prior art PLD integrated circuit 10. Many details of this circuit not necessary for an understanding of the present invention are discussed in co-assigned U.S. Pat. No. 5,260,611. Not all of the conductors employed in circuit 10 are shown in FIG. 1, but enough is shown in this figure for the present discussion. Each LE 12 is represented by a small square in FIG. 1. LEs 12 are grouped together in groups of eight in this particular example. Each of these groups is referred to as a logic array block (LAB) 14. LABs 14 are arranged in six horizontal rows and twenty two vertical columns on circuit 10. Accordingly, there are a total of one hundred thirty two LABs 14 and one thousand fifty six LEs 12 on circuit 10. Each LE 12 is capable of performing a relatively elementary logic function, but extremely complex logic can be performed by variously interconnecting the LEs.

The interconnection circuitry shown in FIG. 1 includes groups of so-called global horizontal conductors (or global horizontal interconnect) 20 interspersed between the horizontal rows of LABs and groups of global vertical conductors (or global vertical interconnect) 22 interspersed between the vertical columns of LABS. These conductors are global in the sense that they extend along an entire row or column of LABs and are not localized to one LAB. Programmable interconnections can be made between select intersecting horizontal and vertical conductors in order to apply signals on the vertical conductors to the horizontal conductors. Although other numbers of conductors can be used if desired, in the depicted embodiment, there are one hundred seventy six conductors in each group of global horizontal conductors 20 and sixteen conductors in each group of global vertical conductors 22. In one specific embodiment, programmable connections are possible between a vertical conductor 22 and just one horizontal conductor 20 in each of the six horizontal rows that the vertical conductor crosses. This limitation is imposed on the general interconnect because the circuitry needed to selectably allow a connection between intersecting conductors takes up a certain amount of area on the chip and this chip area is limited.

The interconnection circuitry shown in FIG. 1 further includes groups of vertical LAB input conductors 24 associated with each LAB 14 for conveying signals from the global horizontal conductors 20 intersected by conductors 24 into the LEs 12 in that LAB. The conductors 24 are part of the LAB interconnect which is local to just one LAB. Finally, the interconnection circuitry shown in FIG. 1 includes a set of universal fast interconnect conductors 30 which are globally connected to all LABs and are designed to transmit fast signals throughout the PLD. Although other numbers of conductors can be used if desired, in the depicted embodiment there are twenty four conductors in each group of LAB input conductors 24 and there are four universal fast conductors 30.

Figure 2:
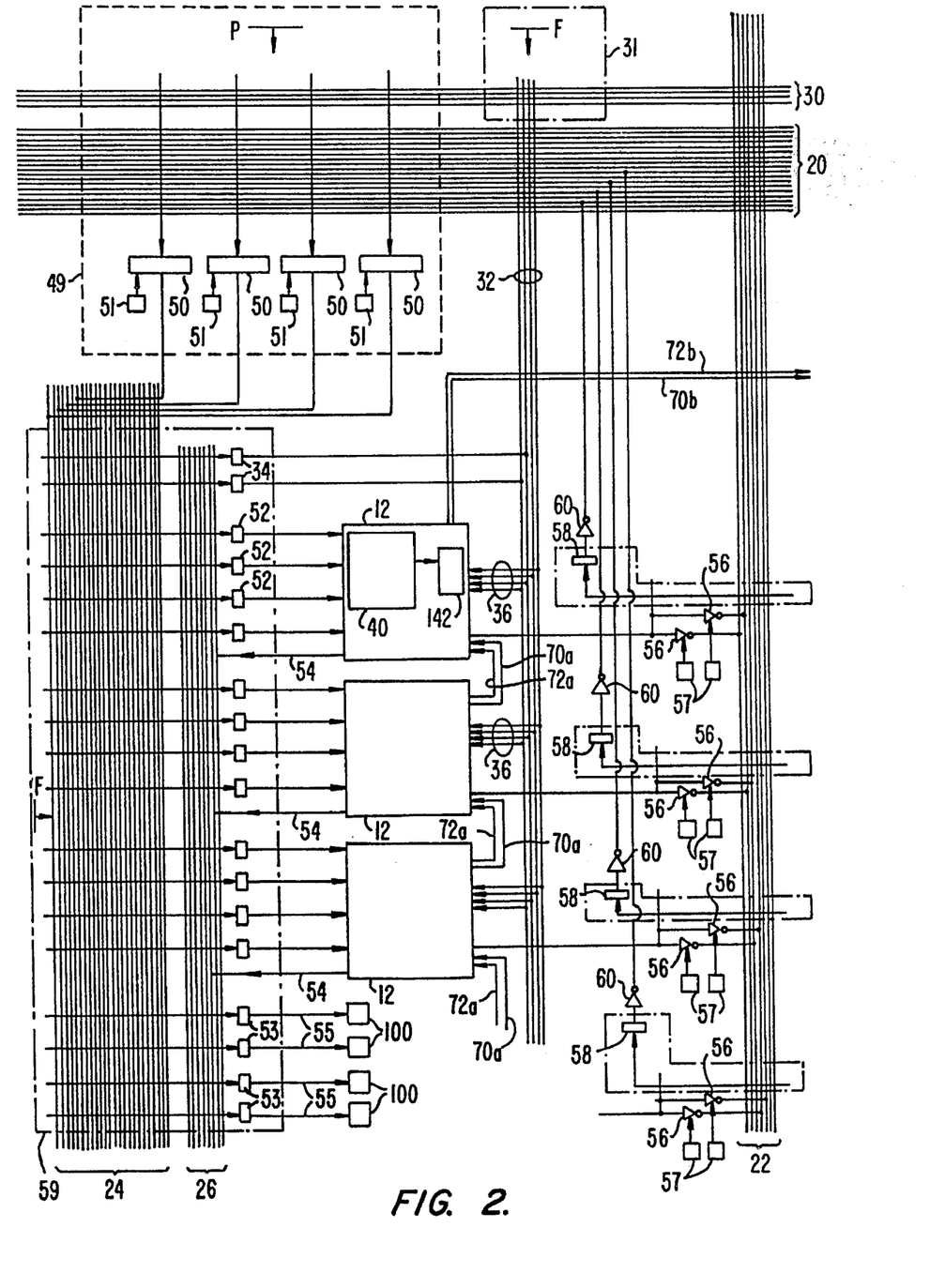
FIG. 2 is a schematic block diagram showing a LAB of FIG. 1 with LAB-based output routing according to the invention.

Turning now to FIG. 2 which shows one possible implementation of part of a typical LAB 14 incorporating enhancements according to the invention, three representative LEs 12 are shown. Although LEs 12 can be implemented in other ways (e.g., as product-term-based macrocells), in the illustrative embodiment shown in FIG. 2 each LE 12 includes a look up table or universal logic block ("ULB") 40 and a flip-flop type device 142.

In addition to the above-described representative LEs 12, FIG. 2 shows portions of representative global horizontal conductors 20, global vertical conductors 22, local LAB input conductors 24, local inter-LAB feed-back conductors 26, and universal fast conductors 30. Each of LAB input conductors 24 can be connected to a selected one (or more) of conductors 20 and 30 via a programmably controlled programmable logic connector ("PLC") 50 (only some of which are shown in FIG. 2). Local inter-LAB conductors 26 connect only to inter-LAB signals and are used primarily for feed-back of LE outputs through lines 54 to the inputs of other LEs in the same LAB.

PLCs 50 can be implemented in any of a wide variety of ways. For example, each PLC 50 can be a relatively simple programmable connector such as a plurality of switches for connecting any one of several inputs to an output. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the depicted embodiment each PLC 50 is a 15-to-1 multiplexer which is controlled by programmable function control elements ("FCEs") 51 to connect one of its fifteen inputs to its output. Each of the fifteen inputs is the signal on a predetermined respective one of conductors 20 or 30. There is one PLC 50 for each of the twenty four LAB input conductors 24. Each of conductors 20 and 30 is connected to two of PLCs 50. Accordingly, each of conductors 20 and 30 is connectable to two of conductors 24. The letter P and the associated arrow symbol inside dotted line 49 indicate that the population of connections from conductors 20 and 30 to the inputs of each of PLCs 50 is a partial population meaning that not every intersection indicates a possible interconnection.

Like PLCs 50, FCEs 51 can also be implemented in any of several different ways. For example, FCEs 51 can be SRAMs, DRAMs, first-in first-out ("FIFO") memories, EPROMs, EEPROMS, function control registers ferro-electric memories, fuses, antifuses, or the like.

Each of the four data inputs to each LE 12 can be connected to any one (or more) of LAB input conductors 24 and/or any one (or more) of local conductors 26 via a PLC 52. PLCs 52 (and similar PLCs 34 which are discussed below) may have any of the characteristics described above for the general case of PLCs 50. However, in the depicted, presently preferred embodiment each of PLCs 52 (and each similar PLC 34) is a 32-to-1 mux so that any one of the twenty-four LAB input conductors 24 or any one of the eight local conductors 26 can be connected to each LAB data input. Accordingly, the letter F and the associated arrow symbol inside chain dotted line 59 indicate that the population of connections from conductors 24 and 26 to PLCs 34 and 52 is a full population meaning that each intersection of lines indicates a possible interconnection. With these interconnections just described, any of the signals on the global horizontal lines 20 in that row or on universal fast interconnects 30 may be connected to any of the LE inputs. To avoid overcrowding the drawing, the FCEs (similar to above-described FCEs 51) for programmably controlling PLCs 34 and 52 are not shown separately, but rather are assumed to be part of elements 34 and 52.

According to the invention, one or more additional lines 55 are included in this area 59 of full population interconnections in one or more of the LABs of the device. As with the LE inputs just described, any of the signals on the global horizontal lines 20 in that row or on universal fast interconnects 30 may be connected to any of these additional lines 55. However, instead of these lines 55 being connected to an LE input or other signal in the LAB, each is connected to an external device I/O pin 100, optionally, the lines 55 may be connected to the output pins through a driver that is not shown. The importance of this additional interconnection will be more fully understood with reference to the additional figures discussed below.

The data output of each LE 12 can be applied (via conductor 54) to a respective one of local conductors 26. These conductors serve only the LEs in the associated LAB 14. In other words, conductors 26 do not extend beyond the associated LAB. The data output of LE 12 can also be applied to either or both of two global vertical conductors 22 (via tri-state drivers 56), and to one of global horizontal conductors 20 (via PLC 58 and tri-state driver 60). The other input or inputs to each PLC 58 are the signals from one or more of global vertical conductors 22. Accordingly, global vertical conductors 22 are selectively connectable to global horizontal conductors 20 via PLCs 58 and tri-state drivers 60. PLCs 58 may be similar to any of the above-described PLCs. The use of tri-state drivers 56 and 60 is advantageous to strengthen signals which may be required to travel relatively long distances throughout circuit 10 and/or which may be inputs to relatively large numbers of other components. Some or all of tri-state drivers 56 and 60 may be controlled (i.e., turned on or off) by FCEs (e.g., FCEs 57) on circuit 10. PLCs 58 are also typically controlled by FCES on the circuit. All of these FCEs may be similar to above-described FCEs 51.

In addition to being available as data inputs to LEs 12, the signals on any of conductors 24 and 26 can also or alternatively be applied to any of local vertical conductors 32 via PLCs 34. In the depicted embodiment, each of PLCs 34 is a 32-to-1 switch, but PLCs 34 can alternatively have any of the characteristics described above for the general case of PLCs 50. Although only two PLCs 34 are shown in FIG. 2, there is preferably one such PLC for each of the four conductors 32. Each of conductors 32 is connectable to any one of universal fast conductors 30 for receiving the signal on the fast conductor. These connections from conductors 30 to conductors 32 are preferably made in the same way that the connections from conductors 24 and 26 to conductors 32 are made, i.e., by PLCs controlled by FCEs (all represented by element 31 in FIG. 2). Again, although each of these PLCs can have any of the characteristics described above for the general case of PLCs 50, in the depicted, presently preferred embodiment each of these PLCs can connect any of conductors 30 to an associated one of conductors 32. The letter F and the arrow symbol inside chain dotted line 31 indicate that the population of possible connections from conductors 30 to each of conductors 32 is a full population. Each of conductors 32 is connectable (via conductors 36) to each of LEs 12. FCE-controlled PLCs in each LE allow these signals to be used for such purposes as flip-flop clock and flip-flop clear. Thus local vertical conductors 32 are known as clock and clear lines and can be driven from fast lines 30 for synchronous clocks and clears (i.e., clocks and clears which come from outside of device 10 and are available everywhere throughout device 10), or from LAB input lines 24 or local lines 26.

There are two other types of LE interconnections shown in FIG. 2 which require discussion. The first of these is carry chain interconnection represented in part by conductors 70a and 70b. These interconnections allow a carry out output of each LE 12 to be used as a carry in input to an adjacent or nearby LE as shown, for example, in commonly assigned, co-pending U.S. patent application Ser. No. 07/880,752 incorporated herein by reference for all purposes. For example, carry chain conductors 70a allow the carry out output of each LE 12 shown in FIG. 2 to be the carry in input to the next higher LE in that Fig. Similarly, carry chain conductor 70b runs from the top-most LE 12 in the LAB fragment shown in FIG. 2 to the bottom-most LE in the horizontally adjacent LAB in the adjacent column of LABS. This allows the carry chain to continue from LAB to LAB if desired.

The other type of LE interconnection remaining to be discussed is illustrated by representative conductors 72a and 72b in FIG. 2 (see also commonly assigned, co-pending U.S. application Ser. No. 07/880,888). These conductors are called cascade connect conductors. They allow the data outputs of adjacent or nearby LEs 12 to be logically combined, if desired, to perform more complex logic functions without the need to pass intermediate data through the general interconnection network. The manner in which cascade connect conductors 72 are employed in the LEs is shown in detail in FIG. 12.

Figure 3:
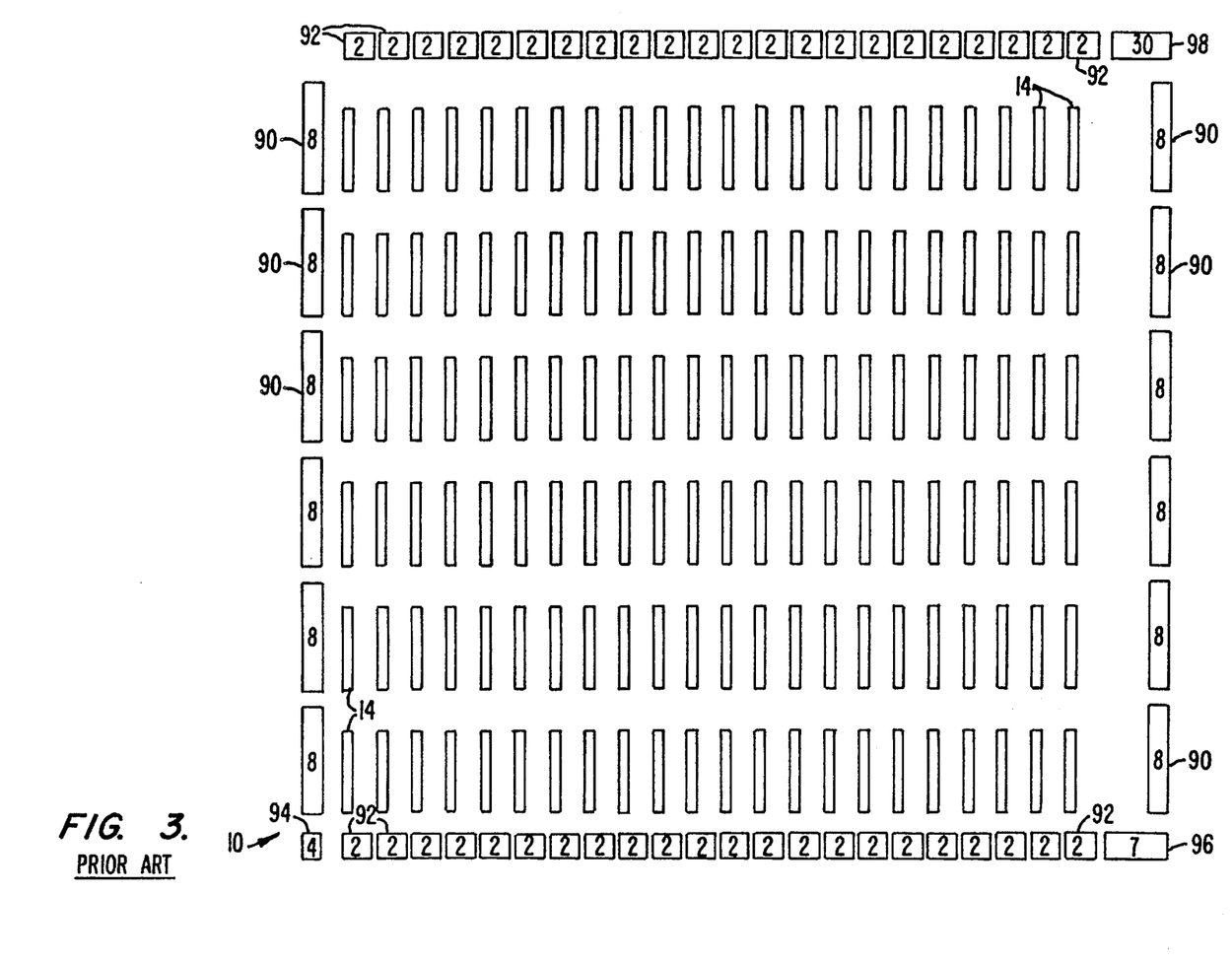
FIG. 3 is a simplified block diagram of a specific PLD showing the locations of I/O pins.

FIG. 3 shows how input/output pins are provided on circuit 10. Six groups 90 of eight input/output pins are shown along each side of circuit 10. Twenty-two groups 92 of two input/output pins are shown along each of the top and bottom of the circuit. In addition, there are four fast input pins 94 respectively connected to fast conductors 30, seven control pins 96 for use during programming of device 10, and approximately thirty supply pins 98 for supplying power and ground potential to device 10.

Figure 4:
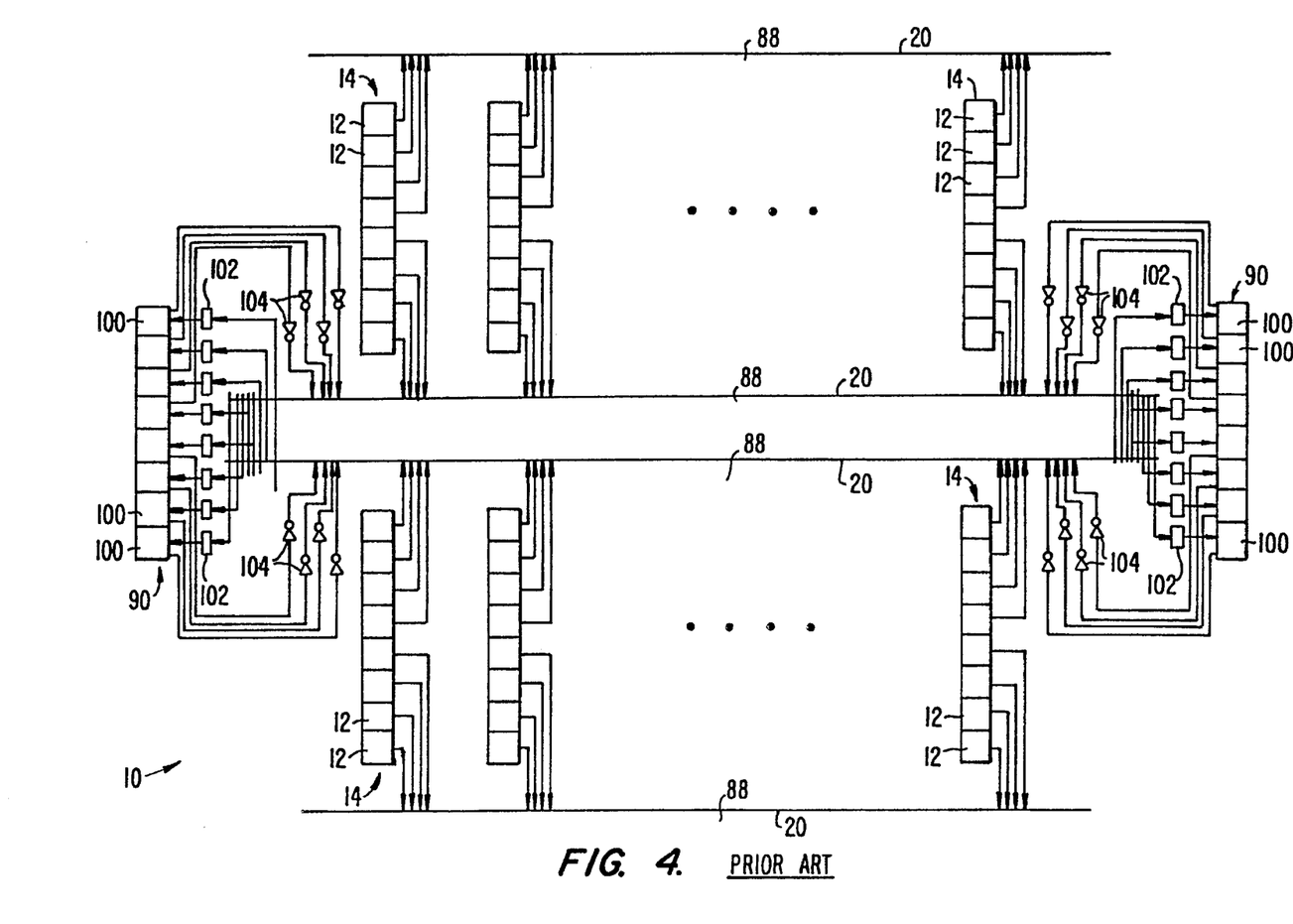
FIG. 4 is a simplified block diagram of a prior art PLD is showing the routing of LE outputs to the I/O pins.

FIG. 4 shows an illustrative embodiment of a prior art arrangement for connecting LE output signals to I/O pins. In FIG. 4 the one hundred seventy six global horizontal conductors 20 associated with each horizontal row of LABs 14 are arranged so that half can receive the outputs of the drivers 60 (FIG. 2) associated with the top four LEs 12 in each LAB in that row, while the other half of these conductors 20 can receive the outputs of the drivers 60 associated with the lower four LEs 12 in each LAB in that row. Accordingly, in FIG. 4 each group of one hundred seventy six global horizontal conductors 20 is shown divided into two subgroups of eighty-eight such conductors, one subgroup being above the associated row of LABs 14, and the other subgroup being below that row of LABs. Each input/output pin 100 in each group 90 of such pins can receive an output via a PLC 102 from a subset of the conductors 20 in a subgroups of eighty-eight such conductors. PLCs 102 can have any of the characteristics described above for the general case of PLCs 50, and PLCs 102 are controlled by programmable FCEs similar to those described above. One of these two subgroups of conductors is associated with the lower LEs 12 in one row of LABs 14, while the other subgroup of conductors is associated with the upper LEs 12 in the LAB row immediately below the first row.

For use as an input pin, each pin 100 is connected through two tri-state drivers to two of conductors 20. Thus each symbol 104 in FIG. 4 represents two tri-state drivers, each of which is programmably controlled (e.g., by an FCE similar to those described above).

One important aspect this prior art circuit for an understanding of the present invention is that all connections to input/output pins 100 are made through the global interconnect via lines 20. For output in this prior art circuit, each global interconnect line 20 can connect to only two particular I/O pins and each vertical interconnect 22 can connect to only two I/O pins. As explained in the discussion of FIG. 2, an output of a LE 12 can connect to only one horizontal interconnect 20 and to two vertical interconnects 22. The LE can therefore directly connect to only thirty output pins: two on its own horizontal line, four on its two vertical lines, and 12 on the six horizontal lines that are accessible from the two vertical lines. If the output signal from an LE is required at a different pin from one of those thirty, the signal must be routed through a different LE.

The LAB illustrated in FIG. 2 according to the invention avoids this limitation by allowing an output pin to be selectively connected to any of the LAB-input lines 24 or inter-LAB lines 26 via PLCs 55. As described above, at least one of LAB-input lines 24 may be connected to any one of the one hundred seventy-six horizontal global conductors 20 associated with that LAB's row. With this interconnection, the output of any LE on the PLD may be connected to any output pin having a LAB-based connection without the need to pass through any other LE.

Figure 5:
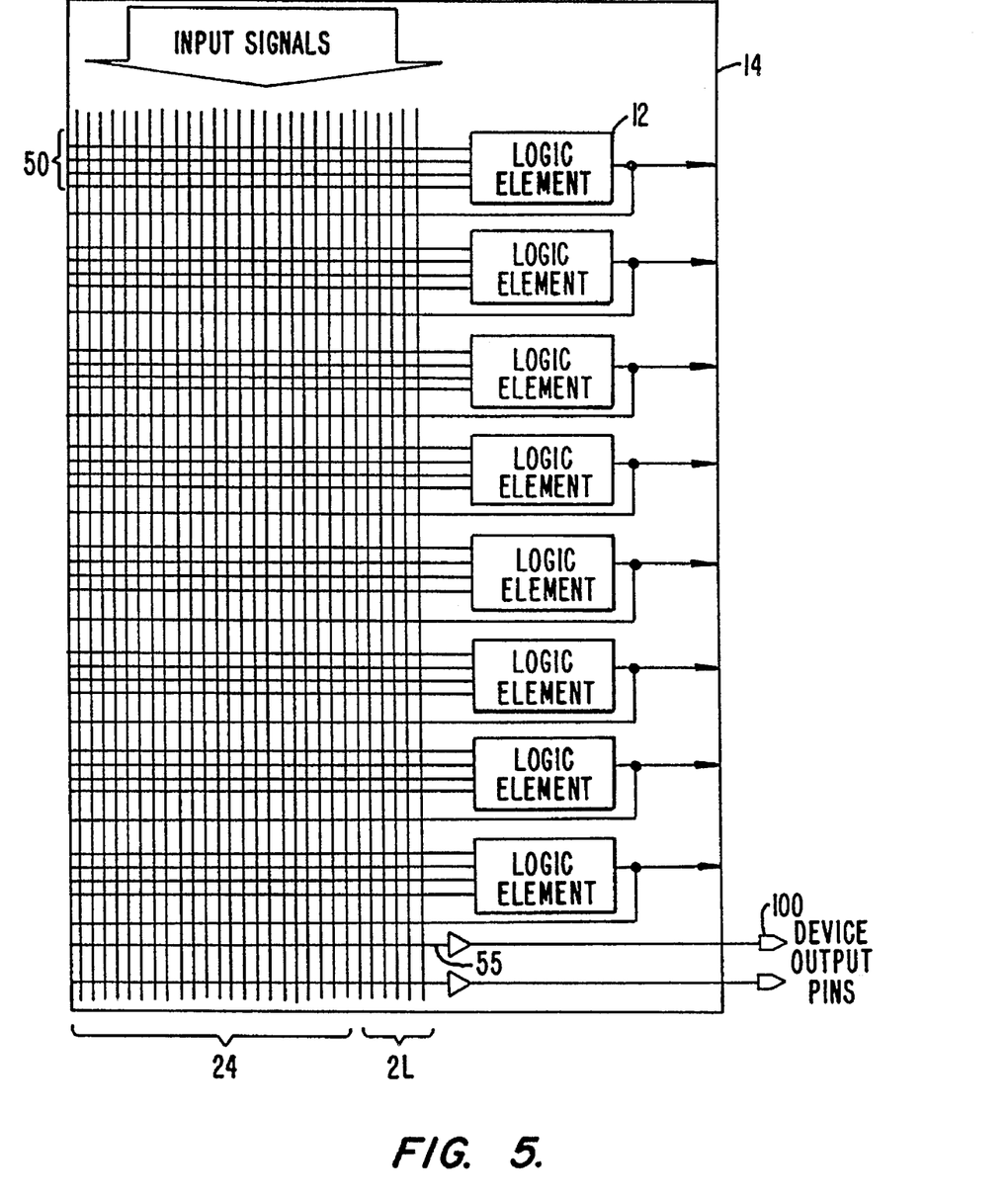
FIG. 5 is a simplified block diagram showing a LAB with LAB-based output routing according to the invention.

FIG. 5 is a simplified block diagram of a LAB 14 showing only those details necessary to illustrate the invention. FIG. 5 illustrates a LAB 14 having eight LEs 12 and having LAB-input lines 24. Two LAB-based output lines 55 are shown which drive the signals to output pins 100.

Figure 6:
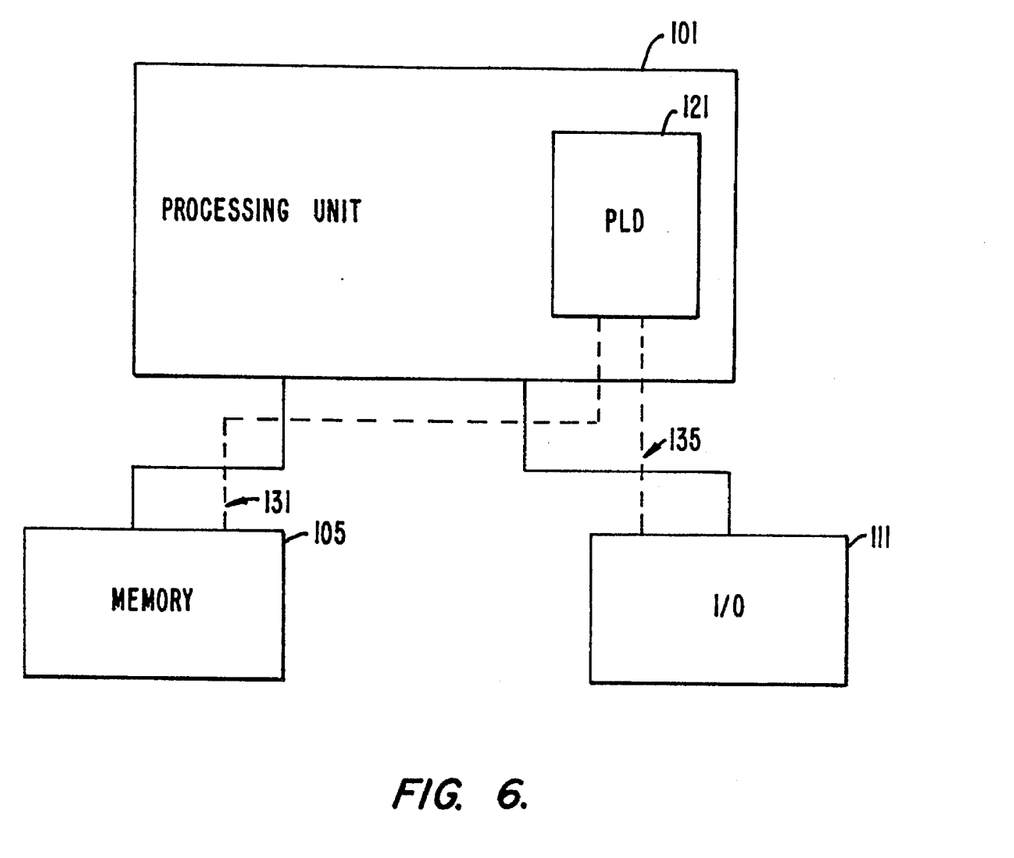
FIG. 6 is a block diagram of a digital processing system including a PLD with LAB-based output routing according to the invention.

FIG. 6 shows a block diagram of a digital system within which the present invention may be embodied. In the particular embodiment of FIG. 6, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. I/O 111 may also be a connection or bus to another processing system that provides input or receives output from 101. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 6. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 6 may embody a plurality of PLDs 121, each performing different system functions.

The system shown in FIG. 6 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 6, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

The invention has now been explained with reference to specific embodiments. However, a number of variations to the invention will be obvious to anyone with skill in the art. For example, the invention need not be limited to circuits that are commonly thought of as PLDs; other types of configurable counter circuits or adder circuits may employ the invention. Also, the particular design of the LABs is not determinative. The invention may be used with SOP-based LABs as well as LUT-based LABs. The invention may also be employed in PLDs having a wide variety of LAB and LE architectures and a number of different interconnect strategies. Additionally, the particular configurations of the global and local interconnect are not determinative. Circuits in which the invention may be employed may employ either a more limited or more extensive global interconnect than those depicted in the specific embodiments- It should also be noted that the device output pins may be configured on different devices as bidirectional input/output pins or as unidirectional output pins. Where the term output pin is used in this application, it is to be understood that an input/output is included as well. Finally, systems incorporating the invention may be any type of information processing system or subsystem. It is therefore intended that the invention not be limited except as specified in the attached claims.

What is claimed is:

1. A configurable electronic device comprising:

a plurality of logic blocks, at least one logic block comprising outputs to other logic blocks, an array of internal interconnection lines within said block programmably connected to inputs of said block, said at least one logic block performing selected logical operations;

a general interconnect structure programmably connecting the outputs of said logic blocks to said array of internal interconnection lines of another of said logic blocks;

an output pin interconnect line, said output pin interconnect line directly programmably connected to said internal interconnection lines without being routed through said general interconnect or any other of said logic blocks and connected directly to an output pin of said configurable logic device.

2. The configurable electronic device according to claim 1 wherein said logic blocks are comprised of a plurality of look-up tables.

3. The configurable electronic device according to claim 1 wherein said general interconnect structure comprises a plurality rows and columns of conductors.

4. The configurable electronic device according to claim 2 wherein data in said look-up tables is stored in static random access memory.

5. The configurable electronic device according to claim 1 further comprising a plurality of multiplexers with inputs connected to said general interconnect structure and outputs connected to said array of internal interconnection lines.

6. The configurable electronic device as recited in claim 1 further comprising an output driver on said output pin interconnect line.

7. The configurable electronic device as recited in claim 1 wherein said general interconnect structure comprises an array of vertical and horizontal interconnect lines between said logic blocks.

8. The configurable electronic device as recited in claim 1 further comprising a plurality of carry chain interconnections said carry chain interconnections programmably connected between carry outputs of one logic block to carry inputs of another logic block forming a carry chain for add operations.

9. The configurable electronic device as recited in claim 1 further comprising cascade connect conductors said cascade conductors logically connecting outputs of a logic element to outputs of an adjacent logic element.

10. The configurable electronic device as recited in claim 1 wherein said array of internal interconnection lines is fully populated to inputs of individual logic elements in said logic block and to said output pin interconnect line.

11. The configurable electronic device as recited in claim 1 wherein the configurable electronic device is connected to a system, said system comprising:

a processing unit operationally connected to;

a memory; and to an input/output interface connecting said system to input and output devices.

12. A programmable logic device comprising:

a plurality of logic array blocks (LABs), at least one LAB comprising a plurality of inputs and outputs and capable of performing a logic function such that said at least one LAB's outputs represent a logical function of its inputs;

a general interconnect structure capable of routing the outputs of one of said LABs to the inputs of another of said LABs;

at least one LAB-based interconnect, each LAB-based interconnect associated with a particular LAB capable of connecting selected lines of said general interconnect to selected input lines of said LAB;

wherein said at least one LAB-based interconnect associated with at least one LAB includes a plurality of output lines connectable to a device I/O pin, said output line directly programmably connected to said LAB-based interconnect without being routed through said general interconnect or any other of said LABs.

13. A programmable logic device as recited in claim 12 wherein said LABs are comprised of a number of look-up tables.

14. A programmable logic device as recited in claim 12 wherein said general interconnect structure comprises a plurality rows and columns of conductors.

15. A programmable logic device as recited in claim 12 wherein data in said look-up tables is stored in static random access memory.

16. A method in a programmable logic device of routing signals in the programmable logic device to device output pins comprising the steps of:

providing a plurality of LABs with a LAB-based interconnect for connecting signals on a plurality of general interconnect lines to input lines of each LAB; and including in said plurality of LAB-based interconnects a plurality of output lines, said output lines being selectively connectable to the same general interconnect lines as the LAB input lines without being routed through any other of said LABs and said output lines each being connectable to an output pin.

17. A configurable logic device comprising:

a plurality of logic array blocks (LABs), arranged in a plurality of rows and columns, at least one LAB having a plurality of inputs and outputs and capable of performing a logic function such that said at least one LAB's outputs represent a logical function of its inputs, said logic function being programmable during chip manufacture or use;

a general interconnect structure comprising a plurality of rows of conductors and a plurality of columns of conductors, said interconnect structure capable of routing select signals between said columns of conductors and said rows of conductors;

LAB output lines for selectively connecting said LAB outputs to said rows or said columns of conductors;

at least one LAB-based input interconnect associated with a particular LAB capable of connecting selected lines of said general interconnect to selected input lines of said LAB;

wherein said at least one LAB-based interconnect associated with at least one LAB includes a plurality of output lines connectable to a device I/O pin without being routed through a logic element in said LAB.

18. The configurable logic device of claim 17 wherein said LAB-based input interconnect is a fully populated interconnection between inputs to logic circuits of said LAB and outputs of a plurality of multiplexers, said multiplexers having their inputs connected to conductors in said general interconnect.

19. The configurable logic device of claim 18 wherein the outputs of said multiplexers are selected by a programmable store.

20. The configurable logic device of claim 19 wherein the programmable store is an SRAM cell.

21. The configurable logic device of claim 17 wherein the LABs are comprised of a plurality of look-up tables.

22. The configurable logic device of claim 17 wherein each output of an LAB is connectable to a limited number of lines in said general interconnect and to a feedback input back into said LAB interconnect.

23. The configurable logic device of claim 17 further comprising a plurality of carry chain interconnections.

24. The configurable logic device of claim 17 further comprising a plurality of cascade connect conductors.

25. A logic array block (LAB) for use in a configurable logic device comprising:

a plurality of LAB-input lines for receiving signals;

a plurality of logic elements (LEs) each having an output and each having a plurality of LE-input lines, said LE-input lines being programmably connectable to said LAB-input lines; and a plurality of device-output lines, said device-output lines being programmably connectable to said LAB-input lines without being routed through any LE.

26. The apparatus according to claim 25 wherein each of said device-output lines is programmably connectable to said LAB-input lines through an output line multiplexer, said output line multiplexer controlled by a programmable store.

27. A digital information processing system comprising:

a main processor operationally connected to;

an input device;

an output device;

a memory; and at least one programmable logic device comprising:

a plurality of logic blocks, at least one logic block comprising outputs to other logic blocks, an array of internal interconnection lines within said block, said at least one logic block performing selected logical operations;

a general interconnect structure programmably connecting the outputs of said logic blocks to said array of internal interconnection lines of another of said logic blocks; and an output pin interconnect line, said output pin interconnect line directly programmably connected to said internal interconnection lines without being routed through any logic devices within said logic block and connected directly to an output pin of said configurable logic device.

28. The digital information processing system of claim 27 wherein said logic blocks are comprised of a plurality of look-up tables and wherein said general interconnect structure comprises a plurality rows and columns of conductors and wherein data in said look-up tables is stored in static random access memory and further comprising a plurality of multiplexers with inputs connected to said general interconnect structure and outputs connected to said array of input interconnections.

* * * * *